(12) United States Patent
Mann et al.

(10) Patent No.: US 8,018,243 B2
(45) Date of Patent: Sep. 13, 2011

(54) MEASUREMENT SIGNAL PROCESSING

(75) Inventors: Ekkehard Mann, Gundelfingen (DE);
Christian Fritsch, Waldkirch (DE);
Christoph Obrecht, Malterdingen (DE)

(73) Assignee: HUETTINGER Elektronik GmbH + Co. KG, Freiburg (DE)

( * ) Notice: Subject to any disclaimer, the term of this patent is extended or adjusted under 35 U.S.C. 154(b) by 500 days.

(21) Appl. No.: 12/276,616

(22) Filed: Nov. 24, 2008

(65) Prior Publication Data
US 2009/0140722 A1 Jun. 4, 2009

(30) Foreign Application Priority Data

Nov. 22, 2007 (DE) .......................... 10 2007 056 468

(51) Int. Cl.
*G01R 31/40* (2006.01)
*G01R 23/14* (2006.01)
(52) U.S. Cl. ................. 324/764.01; 324/605; 324/76.43
(58) Field of Classification Search .................. None
See application file for complete search history.

(56) References Cited

U.S. PATENT DOCUMENTS

| | | | |
|---|---|---|---|
| 5,175,472 A | 12/1992 | Johnson, Jr. et al. | |
| 5,565,737 A | 10/1996 | Keane | |
| 5,770,922 A | 6/1998 | Gerrish et al. | |
| 5,936,481 A * | 8/1999 | Fujii | ........................... 333/17.3 |
| 6,046,594 A | 4/2000 | Mavretic | |
| 6,522,121 B2 | 2/2003 | Coumou | |
| 6,707,255 B2 | 3/2004 | Coumou et al. | |
| 2003/0046013 A1 | 3/2003 | Gerrish | |
| 2006/0232471 A1 | 10/2006 | Coumou | |
| 2007/0082627 A1 | 4/2007 | Church, Jr. | |

FOREIGN PATENT DOCUMENTS

| | | |
|---|---|---|
| EP | 0753876 | 12/2001 |
| EP | 1441576 | 7/2004 |
| WO | 2006135515 | 12/2006 |

OTHER PUBLICATIONS

Analog Devices, "Low Power Mixer/AGC/RSSI 3 V Receiver IF Subsystem", Analog Devices, Inc., 1995, pp. 1-23.

\* cited by examiner

*Primary Examiner* — Minh N Tang
(74) *Attorney, Agent, or Firm* — Fish & Richardson P.C.

(57) ABSTRACT

In order to determine amplitudes of measurement signals originating from an AC power supply and to determine the phase shift (ø) between measurement signals more simply, the measurement signals are processed in measurement signal operation devices to form auxiliary signals each having a constant AC amplitude and to obtain first measurement values (v, a, rssi, $rssi_1$, $rssi_2$), in particular, from amplification factors (v) that are applied to the measurement signal (m, $m_1$, $m_2$). The phase shift between two auxiliary signals (h, h', $h'_1$, $h'_2$) is further determined as a second measurement value, in particular, by means of the time difference (Δt) between the zero passages of the auxiliary signals (h, h', $h'_1$, $h'_2$).

32 Claims, 2 Drawing Sheets

MEASUREMENT SIGNAL PROCESSING

CROSS REFERENCE TO RELATED APPLICATION

This application claims priority under 35 U.S.C. §119(a) to German Patent Application No. 10 2007 056 468.8, filed on Nov. 22, 2007, the entire contents of which are hereby incorporated by reference.

TECHNICAL FIELD

The invention relates to a measurement signal processing apparatus and a method for processing at least two measurement signals from an alternating current (AC) power supply.

BACKGROUND

AC power supplies can be used to supply AC power to electrical plasma processes such as plasma coating or plasma etching. AC power supplies for electrical plasma processes produce electrical powers whose frequency can be between a low-frequency range (for example, about 10 kHz) and a high-frequency range (for example, several or hundreds of MHz, up to several GHz, and in particular, values of 13 MHz, 27 MHz, 160 MHz, or 432 MHz). AC power supplies for electrical plasma processes generally include a generator having a defined real or complex internal resistance and an impedance matching circuit (matchbox) that matches the generally complex impedance of the plasma process or the plasma load to the internal resistance of the generator for improved or optimum power transmission. Since electrical plasma processes have the property of changing their impedance in a dynamic and non-predictable manner, and since undesirable local discharges (arcs) may further take place in the plasma and bring about an instantaneous change in impedance, the impedance matching circuit and optionally also the generator power are continuously adjusted or the flow of power from the generator to the plasma load can be completely interrupted.

SUMMARY

In some general aspects, a measurement signal processing apparatus is configured to process at least two measurement signals from an AC power supply. The apparatus includes a measurement signal operation device associated with each measurement signal and configured to generate an auxiliary signal having a constant AC amplitude.

Implementations can include one or more of the following features. For example, the measurement signal operation devices can each include a signal control unit configured to process the measurement signal to form an auxiliary signal, and each signal control unit can output a variable that constitutes a first measurement value that represents the amplitude of the measurement signal, or from which such a first measurement value can be established. The signal control unit can be configured to amplify the measurement signal to form the auxiliary signal.

The measurement signal operation devices can each include an intermediate frequency unit that is connected to a heterodyne frequency generator and that is configured to convert the measurement signal into an intermediate frequency signal. The intermediate frequency unit can include a mixer. The measurement signal operation devices can each contain a filter. The filter can include one or more of a band-pass filter that receives the measurement signal and an intermediate frequency filter that receives the intermediate frequency signal.

The measurement signal operation devices can each include, as a module, an integrated circuit. The integrated circuit can be a pre-fabricated intermediate frequency receiver circuit.

The measurement signal processing apparatus can include an evaluation unit that is connected downstream of the measurement signal operation devices and is configured to evaluate the auxiliary signals and to generate at least one second measurement value from one or more of the evaluation result and the first measurement values. The evaluation unit can include a circuit arrangement for establishing the phase shift between at least two auxiliary signals. The evaluation unit can include a digital circuit. The evaluation unit can include a digital signal processor.

The measurement signal processing apparatus can include A/D converters that receive one or more of the first measurement values and the auxiliary signals (h, h', h'1, h'2). The A/D converters can be part of the evaluation unit.

The measurement signal processing apparatus can include comparators that receive the auxiliary signals. The comparators can be part of the measurement signal operation devices.

The measurement signal processing apparatus can include an evaluation unit that is connected downstream of the measurement signal operation devices and that is configured to analyze the auxiliary signals, where the evaluation unit includes one or more of digital inputs and one-bit converters for establishing zero crossings of the auxiliary signals, and is configured to generate at least one second measurement value from the established zero crossings. The measurement signal processing apparatus can include a digital memory that is integrated in the evaluation unit or is connected thereto and is configured to store calibration values.

The measurement signal processing apparatus can include a control unit that is connected to one or more of the measurement signal operation devices and the evaluation unit, and is configured to generate at least one control signal from one or more of the first measurement values and the at least one second measurement value. The control unit can include a digital circuit.

The measurement signal processing apparatus can include an evaluation unit that is connected downstream of the measurement signal operation devices and that is configured to analyze the auxiliary signals, where the evaluation unit includes at least one or more of a comparator and a window discriminator and is configured to analyze one or more of the first measurement values and the at least one second measurement value.

In another general aspect, an AC plasma power supply device has a generator that supplies power to a plasma load, to which the output power generated is supplied and from which reflected power is directed back to the plasma power supply device at least in the event of mismatching. The plasma power supply device includes a measurement signal processing apparatus for processing at least two measurement signals from the AC plasma power supply device, the measurement signal processing apparatus having a measurement signal operation device associated with each measurement signal and configured to generate an auxiliary signal having a constant AC amplitude; and at least two measurement locations between the generator and the plasma load that enable detection of the measurement signals at the respective measurement locations.

Implementations can include one or more of the following features. For example, the plasma power supply device can include a transfer device configured to transfer blanking pulses for the pulsed generator to the measurement signal processing apparatus. The at least two measurement locations can be local to each other but have different circumstances.

In another general aspect, at least two measurement signals from an AC plasma power supply are processed. The at least two measurement signals are detected along a power supply line between a generator of the AC plasma power supply and a plasma load that is connected to the AC plasma power supply, and an auxiliary signal having a constant AC amplitude is generated from each of the measurement signals by amplifying the at least two measurement signals using an amplification feedback control loop.

Implementations can include one or more of the following features. For example, first measurement values that represent the amplitudes of respective measurement signals can be generated when the measurement signals are processed to form the auxiliary signals. The first measurement values can be generated from amplification factors that are applied to the respective measurement signals with an amplifier.

The measurement signals can be converted into intermediate frequency signals by heterodyning with a constant heterodyne frequency the measurement signals, where the heterodyne frequency is substantially identical for all the measurement signals, and the intermediate frequency signals can be processed with the amplification feedback control loop to form the auxiliary signals.

The auxiliary signals can be evaluated by passing each auxiliary signal through a one-bit converter, and establishing a zero crossing of each auxiliary signal with a zero crossing detector, and at least one second measurement value can be generated from one or more of the evaluation result including the established zero crossings and the first measurement values. The at least one second measurement value can include the phase shift (ø) between two auxiliary signals, and the phase shift can be generated by calculating a time difference ($\Delta t$) between zero crossing of the auxiliary signals. A phase shift between the at least two measurement signals can be determined by determining a time difference between zero crossings of the auxiliary signals.

The method and measurement signal processing apparatus allow the establishment of measurement signal amplitudes, which change rapidly and in a large dynamic range, and configures the establishment of the phase shift between measurement signals more simply and therefore allows more reliable control of the generator and/or the impedance matching circuit. The amplitude of the measurement signal is the magnitude of the change in the waveform of the signal, which is an oscillating variable, with each oscillation.

The measurement signal processing apparatus includes a measurement signal operation device associated with each measurement signal in order to generate an auxiliary signal having waveform with a substantially constant AC amplitude. In this manner, auxiliary signals that are further intended to be evaluated are provided in a simplified manner. It is easier to measure the phase between the auxiliary signals because the auxiliary signal has a substantially constant AC amplitude.

In some implementations, the measurement signal operation devices can each include a signal control unit in order to process, in particular amplify, the measurement signal to form an auxiliary signal, with each signal control unit outputting a variable that constitutes a first measurement value that represents the amplitude of the measurement signal or from which such a first measurement value can be established. In this instance, a first measurement value is already generated or output when the auxiliary signals are generated.

Each signal control unit typically contains a feedback loop for adjusting the measurement signal. The signal control unit adjusts the measurement signal to obtain an auxiliary signal having a substantially constant AC voltage amplitude and provides the control value, for example, the amplification v, or the reciprocal value thereof (1/v), as the first measurement value for the amplitude of the measurement signal. Depending on the construction of the feedback loop, the measurement value may behave directly or inversely proportionally relative to the amplitude of the measurement signal. Logarithmic measurement values can further be output as radio signal strength indicator signals (rssi signals). The measurement signal operation devices can each contain, as a device or a module, a pre-fabricated intermediate frequency receiver circuit such as an integrated circuit AD607 from Analog Devices, which is commonly used for receivers, and/or a comparable integrated circuit.

The measurement signals are measured at measurement locations at which a voltage measurement or a current measurement is carried out and have the frequency of the AC power supply, in particular, the fundamental frequency of a plasma current input. In some implementations, the measurement signals can be taken at measurement locations that are local to each other, but have different circumstances, instances, conditions, or states. For example, the measurement signals can correspond to the measurement of forward power and reflected power at a directional coupler. The measurement signals can be taken at two measurement locations.

If the fundamental frequency of the AC power supply is high, for example, higher than 1 MHz, the measurement signals can first be converted into intermediate frequency signals. To that end, the measurement signal operation devices can each have an intermediate frequency unit, in particular, a mixer that is connected to a heterodyne frequency generator, in order to convert the measurement signal into an intermediate frequency signal. This is carried out by mixing the measurement signal in a mixer with a heterodyne signal from a local oscillator with a heterodyne frequency that differs from the fundamental frequency of the generator by the intermediate frequency value. In order to be able to measure a phase shift between the intermediate or auxiliary signals, the measurement signal operation devices are supplied with the same heterodyne frequency.

In order to remove disruptions in harmonic waves from the measurement signals and to clean disruptions from the intermediate frequency signals, the measurement signal operation devices can each include a filter, in particular, a bandpass filter, for the measurement signal and/or an intermediate frequency filter, in particular, a bandpass filter, for the intermediate frequency signal.

In another configuration, the measurement signal processing apparatus can include an evaluation unit that is connected downstream of the measurement signal operation devices in order to evaluate the auxiliary signals and to generate at least one second measurement value from the evaluation result and/or the first measurement values. The phase shift between at least two auxiliary signals is preferably established as the second measurement value. This is carried out at constant, particularly identical, signal levels. This can be readily carried out by measuring the temporal spacing of the zero crossings of the waveforms of the auxiliary signals. If rectangular signals are first formed from the more or less sinusoidal waveforms of the auxiliary signals in a comparator or a Schmitt trigger, that spacing measurement is particularly simple. The phase shift is $2\pi \Delta t/T$ or $2\pi f \Delta t$, where f is the signal frequency of the auxiliary signals and T is the period.

In one configuration, the evaluation unit can be constructed as a digital circuit, preferably as a digital signal processor that contains a digital evaluation of the measurement values. To that end, the measurement values and the auxiliary signals are first digitized. Comparatively slow A/D converters are sufficient for tracking the first measurement values that represent the amplitudes. They may be separate or integrated in the module of the digital evaluation unit. Although a higher scan rate is necessary for measuring the spacing of the zero crossings of the auxiliary signals, a one-bit converter or a digital input of the digital circuit that is scanned in a correspondingly frequent manner is sufficient in the case of the rectangular signals. The A/D converters provided for the first measurement values and/or the auxiliary signals can be part of the evaluation unit. The comparators, which can be Schmitt triggers, for the auxiliary signals can be part of the measurement signal operation devices.

A digital memory that is integrated in the evaluation unit or that is connected thereto can further be provided for storing calibration values. The calibration values can be stored in a table that is in the form of a flash memory. In this configuration, the measurement signal processing apparatus is subjected to calibration after its production or in the field. The calibration or correction values can be stored in the digital memory, which is preferably non-volatile, and can be taken into consideration during the digital evaluation of the measurement values.

In another configuration, the polarities of the measurement signals are examined and corrected during the calibration. Incorrectly soldered components, such as, for example, measurement transformers, can thereby be recognized and the operation thereof can be safeguarded in spite of the incorrect assembly.

The measurement signal processing apparatus can include a control unit, which is connected to the measurement signal operation devices and/or the evaluation unit, in order to generate at least one control signal from the first measurement values and/or the at least one second measurement value, with the control unit being able to be constructed at least partially in the digital circuit. The evaluation unit preferably includes at least one comparator and/or one window discriminator in order to check the first measurement values and/or the at least one second measurement value.

In this additional configuration of the measurement signal processing apparatus, the measurement values are examined in terms of plausibility. This may be carried out, for example, by using a comparator or a window discriminator. The information acquired is supplied to the control unit, in particular in order to be able to recognize and react to undesirable states, such as, a short-circuit, a lack of load and/or the occurrence of local discharges.

In another general aspect, a plasma flow supply device has a generator for the power supply of a plasma load, to which the output power generated is supplied and from which reflected power is directed back at least in the event of mismatching with respect to the plasma flow supply device, and has a measurement signal processing apparatus and at least two measurement locations (which can be local to each other but taken at different circumstances, as discussed above) for detecting a measurement signal.

The measurement signal processing apparatus receives measurement signals from at least two measurement locations, generates auxiliary signals having constant AC amplitude in measurement signal operation devices, and provides the amplitudes of the measurement signals as the first measurement values. The time difference between two auxiliary signals is the phase shift and is established as the second measurement value. The control unit receives the amplitudes and phase shifts or the measurement values and accordingly controls the generator and the impedance matching circuit. The control unit generates, on the basis of the measurement values, control outputs for the impedance matching circuit and/or for the output power of the generator.

If the generator is used in pulsed operation, a communications device can be provided in order to transmit the blanking pulses for the generator to the measurement signal processing apparatus, preferably the evaluation unit. In another configuration of the measurement signal processing apparatus, it is used together with a generator that operates with pulse control operation. The information concerning the presence of a blanking pulse is provided to the measurement signal processing apparatus so that the measurement values are examined only while the generator signal is present.

In another general aspect, at least two measurement signals are processed by generating, from each of the measurement signals, an auxiliary signal having a constant AC amplitude.

First measurement values that represent the amplitude of a measurement signal can be generated when the measurement signals are processed to form auxiliary signals. The first measurement values can be generated from the amplification factors that are applied to the measurement signal.

The auxiliary signals can be evaluated, in particular, compared with each other, and at least a second measurement value can be generated from the evaluation result and/or the first measurement values. The phase shift between two auxiliary signals can be established as the second measurement value, in particular, with the time difference between the zero crossings of the auxiliary signals being established. The measurement signals can further be converted into intermediate frequency signals before the amplification by heterodyning with a constant heterodyne frequency that can be identical for all the measurement signals.

Further advantages and features will be appreciated from the drawings and the following description. The above-mentioned features and those set out below can be used according to the invention individually or in any combination with each other.

The measurement signal processing apparatus according to the invention is illustrated in one embodiment in the drawings. The features shown in the drawings are purely schematic and should not be understood to be to scale.

DETAILED DESCRIPTION

Figure 1:
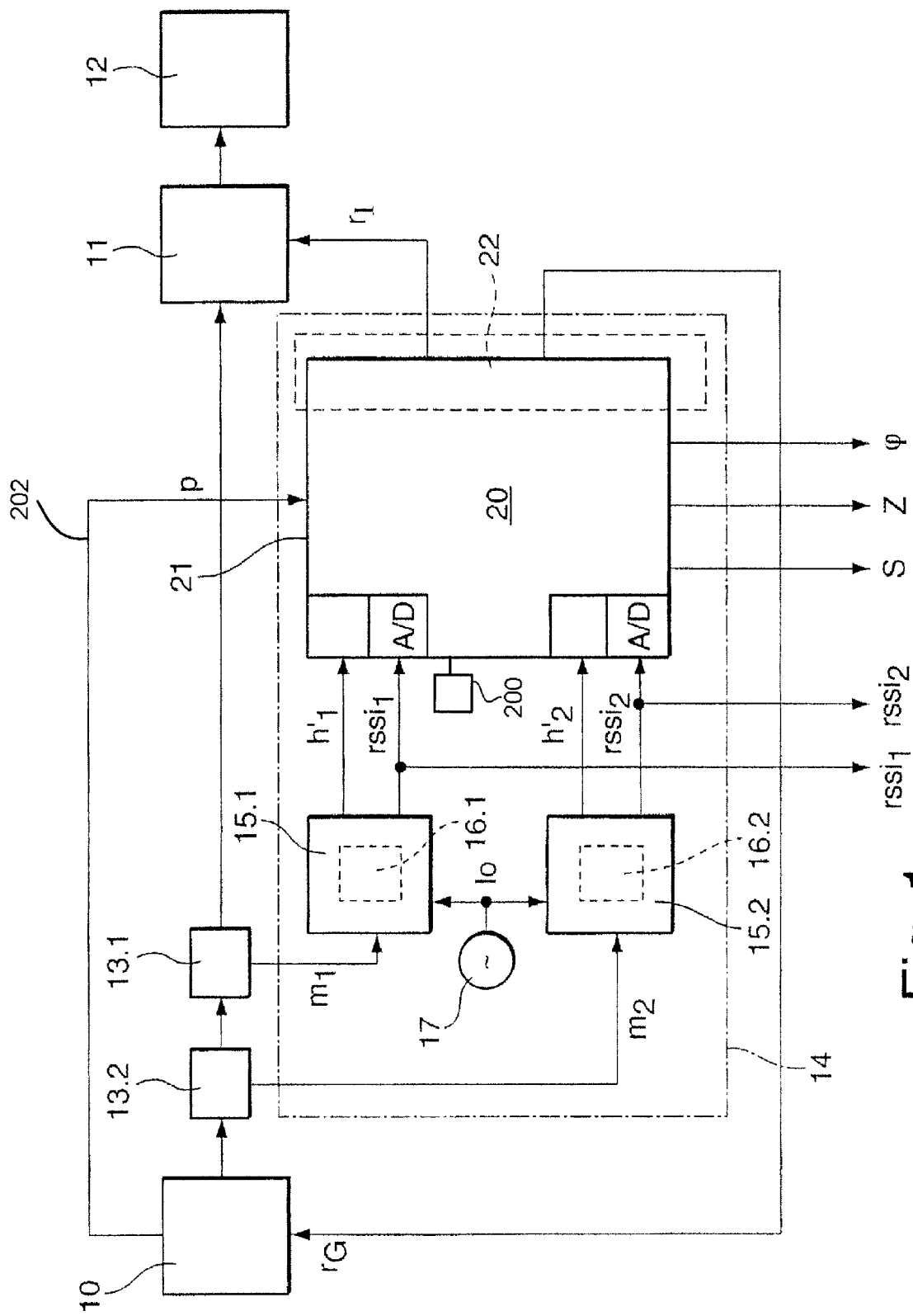
FIG. 1 is a block diagram of a plasma power supply device having a measurement signal processing apparatus.

FIG. 1 is a block diagram of a plasma power supply device having a generator 10 and an impedance matching circuit 11. The low-frequency or high-frequency output power generated in the generator 10 is supplied to a plasma load 12 and is detected at measurement locations 13.1, 13.2, which are arranged between the generator 10 and the impedance matching circuit 11. As discussed above, the measurement locations 13.1, 13.2 can be local to each other but can have different circumstances (for example, one location can measure forward power while the other location can measure reflected power but both powers can be taken near each other in space). Measurement signals $m_1$, $m_2$ detected at the measurement locations 13.1, 13.2 are processed in a measurement signal processing apparatus 14 and, at that location, first supplied to measurement signal operation devices 15.1, 15.2. The measurement signal operation devices 15.1, 15.2 each include a signal control unit 16.1, 16.2 and are connected to a heterodyne frequency generator 17, which is a local oscillator. The measurement signal operation device 15.1, 15.2 amplifies measurement signals $m_1$, $m_2$ to form auxiliary signals $h'_1$, $h'_2$ and generates first measurement values $rssi_1$, $rssi_2$, which represent the amplitude of the measurement signals $m_1$, $m_2$.

The auxiliary signals $h'_1$, $h'_2$ and the first measurement values $rssi_1$, $rssi_2$ are evaluated in an evaluation unit 20, which is constructed as a digital circuit 21. The evaluation unit 20 generates the apparent power S, the apparent resistance Z, and the phase shift ø between the auxiliary signals $h'_1$, $h'_2$ or between the measurement signals $m_1$, $m_2$ as second measurement values. The second measurement values S, Z, ø can be supplied to a control unit 22. The control unit 22 is constructed at least partially in the digital circuit 21 and generates control signals $r_G$, $r_I$ for controlling the generator 10 or the impedance matching circuit 11, respectively.

The generator 10 can be operated in a pulsed operation, that is, power is supplied to the load 12 in pulses rather than continuously. In pulsed operation, a blanking pulse p can be input to the generator 10, the blanking pulse p determines the period of time when no power is delivered or generated by the generator 10. If the generator 10 is used with pulse control operation, the blanking pulse p can be transferred from the blanking pulse generator 10 to the evaluation unit 20 through a transfer device such as a line or cable 202 in order to deactivate the generator 10 so that the measurement values $rssi_1$, $rssi_2$ and the auxiliary signals $h'_1$, $h'_2$ are examined only while a generator signal is present. Thus, no evaluation takes place when no power is supplied to the load 12 (in this case, the generator 10 is blanked out). Thus, for example, the evaluation unit 20, or another arc detection system that monitors the plasma process, can deactivate the generator 10 (which would thereby transfer the blanking pulse) using the control signal $r_G$ if the evaluation unit 20 determines that a fault or arc has occurred. In this case, the evaluation unit 20 is also deactivated with the generator 10 so that the evaluation unit 20 would not examine the measurement values and auxiliary signals while the blanking pulse is present. In other implementations, the blanking pulse can be generated by an arc management unit (and the evaluation unit 20 can be part of such a unit) or by the evaluation unit 20 for shutting off the generator 10 in the event of an arc.

Figure 2:
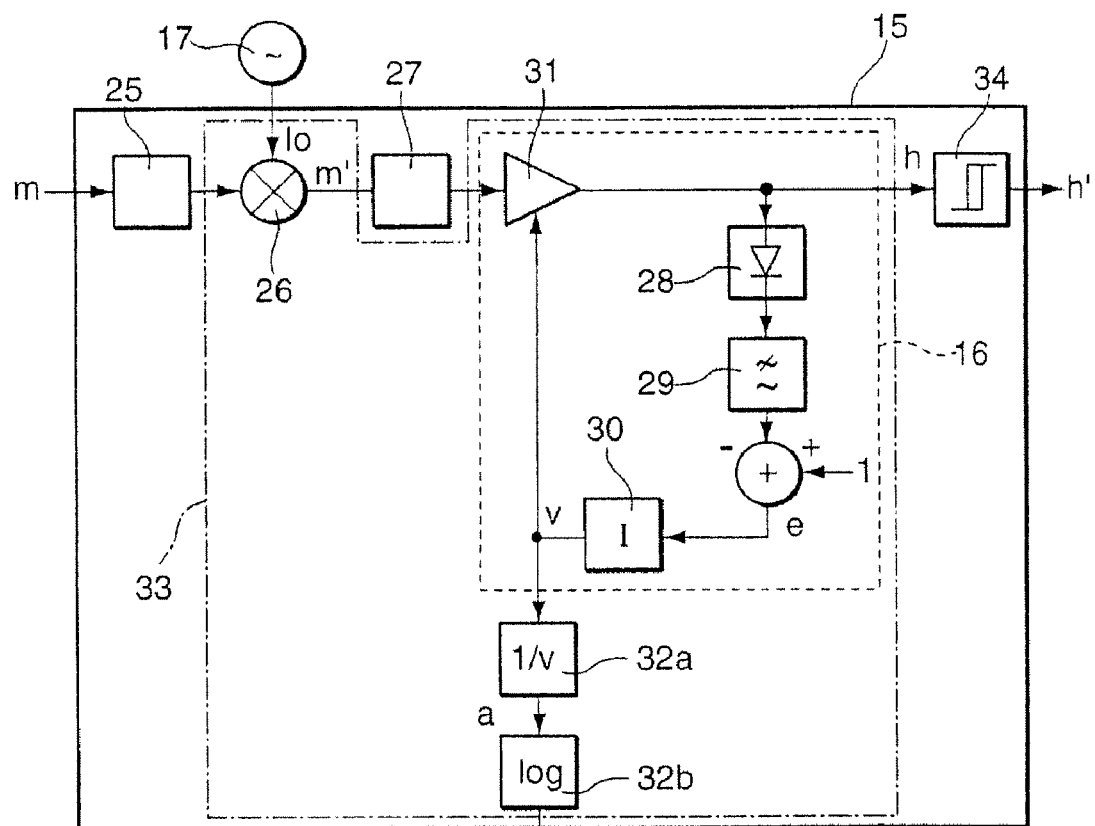
FIG. 2 is a block diagram of a measurement signal operation device of the measurement signal processing apparatus of FIG. 1.

FIG. 2 is a block diagram of a measurement signal operation device 15 (which can be, for example, the measurement signal operation devices 15.1 or 15.2), in which a measurement signal m (such as the measurement signal $m_1$ or $m_2$) first passes a bandpass filter 25 and is converted into an intermediate frequency signal m' in a mixer 26 using a heterodyne frequency $I_O$ from the heterodyne frequency generator 17. Subsequently, the intermediate frequency signal m' passes an intermediate frequency filter 27 and is amplified in the signal control unit 16 (which can be the signal control unit 16.1 or 16.2) to form the auxiliary signal h. To that end, the signal control unit 16 includes a feedback loop having a diode 28, a low pass filter 29, a controller 30 that is in the form of an integrator, and an amplifier 31 that generates the auxiliary signal h. The intermediate signal m' is filtered by the filter 27, amplified by the amplifier 31, rectified by the diode 28, low pass-filtered by the low pass filter 29, and subsequently compared with a desired value, for example, 1. The controller 30 in the feedback loop ensures that, in the steady state (in which the auxiliary signal h has a constant AC amplitude), the control difference e becomes 0 and therefore the generated auxiliary signal h has the magnitude determined by the desired value. The controller 30 outputs an amplification factor v that is transmitted to the amplifier 31 to provide the amplification needed to cause the auxiliary signal h to be at a constant AC amplitude. The auxiliary signal h generated is converted in a Schmitt trigger 34 into a rectangular auxiliary signal h' to be output by the measurement signal operation device 15. The amplification factor v transmitted by the controller 30 to the amplifier 31 is supplied to a first measurement value generator 32a, which outputs the reciprocal value of the amplification factor v as the first measurement value a (thus, a=1/v). In a second measurement value generator 32b, a logarithmic first measurement value rssi=log(a), which is to be output, is generated from the first measurement value a.

A module 33 of the measurement signal operation device 15 includes the following components: the mixer 26 for generating the intermediate frequency signal m', the signal control unit 16 with the controller 30 for generating the auxiliary signal h with constant amplitude, connections for the external intermediate frequency filter 27, and the measurement value generators 32a, 32b for generating the logarithmic amplitude magnitude rssi as the first measurement value. The module 33 can be a pre-fabricated intermediate frequency receiver circuit. In some implementations, the module 33 in the measurement signal operation device 15 can be integrated circuit AD607 from Analog Devices.

Figure 3:
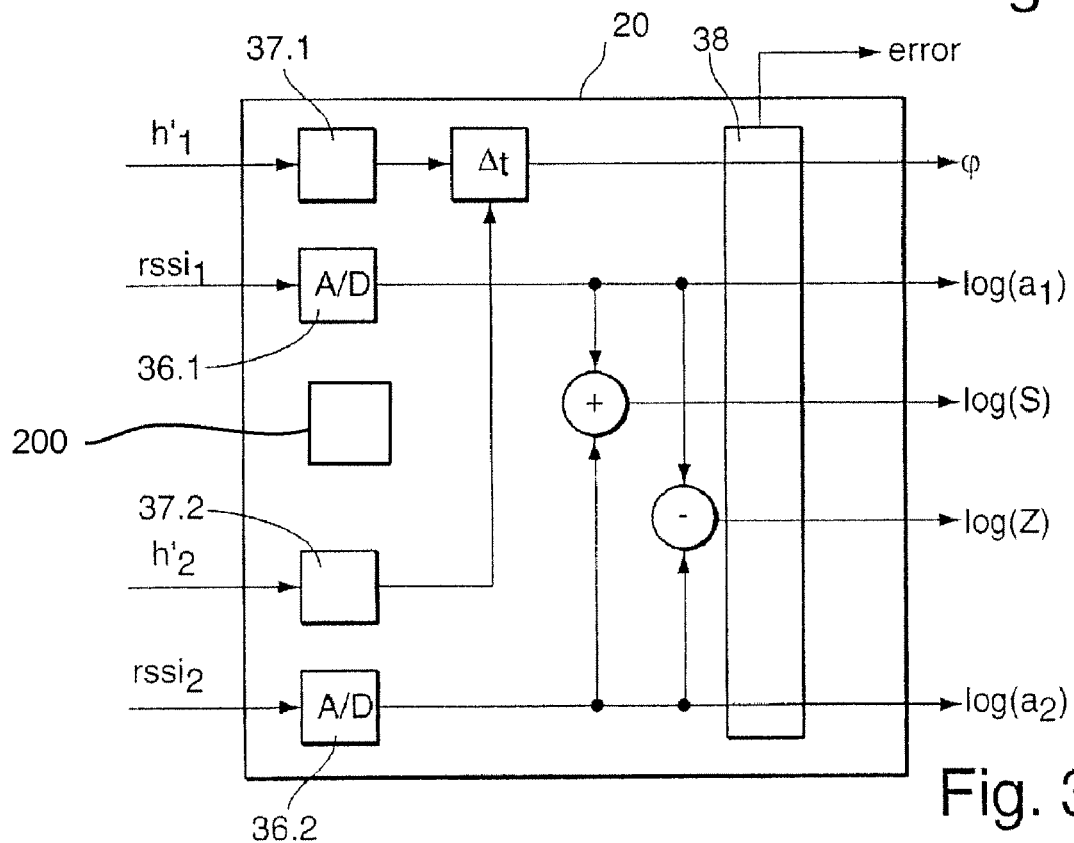
FIG. 3 is a block diagram of an evaluation unit of the measurement signal processing apparatus of FIG. 1.

FIG. 3 shows the evaluation unit 20, which includes A/D converters 36.1, 36.2 for the first measurement values $rssi_1$, $rssi_2$, and one-bit converters 37.1, 37.2 for establishing the zero crossings of the auxiliary signals $h'_1$, $h'_2$. The evaluation unit 20 can include a processor for performing any or all of the functions. The evaluation unit 20 establishes the phase shift ø between the measurement signals $m_1$, $m_2$ as the second measurement value by measuring a time difference $\Delta t$ between the zero crossings of the auxiliary signals $h'_1$, $h'_2$. The evaluation unit 20 can derive the apparent power S and the apparent resistance Z as additional second measurement values from the first measurement signals $rssi_1$, $rssi_2$. If the measurement values $a_1$ and $a_2$ represent the current and the voltage, respectively, then the product thereof is a measure for the apparent power S. It can readily be seen that, instead of the product in logarithmic first measurement values $rssi_1=\log(a_1)$ and $rssi_2=\log(a_2)$, the sum has to be formed in order to obtain a logarithmic measure log(S) of the apparent power S. Accordingly, the quotient or, in logarithms, the difference between the two measurement values $a_1$ and $a_2$ or $rssi_1$ and $rssi_2$ is a measure for the apparent resistance Z or its logarithm log(Z). In a comparator 38, the measurement values ø, $\log(a_1)$, $\log(a_2)$, log(S), log(Z) can be checked in terms of plausibility and optionally an additional error signal can be output as an error message.

Other implementations are within the scope of the following claims.

For example, the evaluation unit 20 can include A/D converters for signals other than the first measurement values rssi. Thus, the evaluation unit 20 can include A/D converters for other first measurement values v, a or for the auxiliary signals h, h', $h'_1$, $h'_2$. As another example, the measurement signal processing apparatus 14 can include a digital memory 200 that is integrated in the evaluation unit 20 (as shown in FIG. 3) or is connected to the evaluation unit 20 (and shown in FIG. 1) and is configured to store calibration values for access by the processor of the evaluation unit 20.

What is claimed is:

1. A measurement signal processing apparatus for processing at least two measurement signals from an AC power supply, the apparatus comprising:
   a measurement signal operation device associated with each measurement signal and configured to generate an auxiliary signal having a constant AC amplitude.

2. The measurement signal processing apparatus of claim 1,
   wherein the measurement signal operation devices each comprise a signal control unit configured to process the measurement signal to form an auxiliary signal, and
   wherein each signal control unit outputs a variable that constitutes a first measurement value that represents the amplitude of the measurement signal, or from which such a first measurement value can be established.

3. The measurement signal processing apparatus of claim 2, wherein the signal control unit is configured to amplify the measurement signal to form the auxiliary signal.

4. The measurement signal processing apparatus of claim 1, wherein the measurement signal operation devices each include an intermediate frequency unit that is connected to a heterodyne frequency generator and that is configured to convert the measurement signal into an intermediate frequency signal.

5. The measurement signal processing apparatus of claim 4, wherein the intermediate frequency unit includes a mixer.

6. The measurement signal processing apparatus of claim 4, wherein the measurement signal operation devices each contain a filter.

7. The measurement signal processing apparatus of claim 6, wherein the filter includes one or more of a bandpass filter that receives the measurement signal and an intermediate frequency filter that receives the intermediate frequency signal.

8. The measurement signal processing apparatus of claim 1, wherein the measurement signal operation devices each comprise, as a module, an integrated circuit.

9. The measurement signal processing apparatus of claim 8, wherein the integrated circuit is a pre-fabricated intermediate frequency receiver circuit.

10. The measurement signal processing apparatus of claim 1, further comprising an evaluation unit that is connected downstream of the measurement signal operation devices and is configured to evaluate the auxiliary signals and to generate at least one second measurement value from one or more of the evaluation result and the first measurement values.

11. The measurement signal processing apparatus of claim 10, wherein the evaluation unit comprises a circuit arrangement for establishing the phase shift between at least two auxiliary signals.

12. The measurement signal processing apparatus of claim 10, wherein the evaluation unit includes a digital circuit.

13. The measurement signal processing apparatus of claim 12, wherein the evaluation unit includes a digital signal processor.

14. The measurement signal processing apparatus of claim 10, further comprising A/D converters that receive one or more of the first measurement values and the auxiliary signals (h, h', h'$_1$, h'$_2$).

15. The measurement signal processing apparatus of claim 14 wherein the A/D converters are part of the evaluation unit.

16. The measurement signal processing apparatus of claim 1, further comprising comparators that receive the auxiliary signals.

17. The measurement signal processing apparatus of claim 16, wherein the comparators are a part of the measurement signal operation devices.

18. The measurement signal processing apparatus of claim 16, further comprising:
   an evaluation unit that is connected downstream of the measurement signal operation devices and that is configured to analyze the auxiliary signals,
   wherein the evaluation unit comprises one or more of digital inputs and one-bit converters for establishing zero crossings of the auxiliary signals, wherein the evaluation unit is configured to generate at least one second measurement value from the established zero crossings.

19. The measurement signal processing apparatus of claim 18, further comprising a digital memory that is integrated in the evaluation unit or is connected thereto and is configured to store calibration values.

20. The measurement signal processing apparatus of claim 1, further comprising a control unit that is connected to one or more of the measurement signal operation devices and the evaluation unit, and is configured to generate at least one control signal from one or more of the first measurement values and the at least one second measurement value.

21. The measurement signal processing apparatus of claim 20, wherein the control unit is a digital circuit.

22. The measurement signal processing apparatus of claim 1, further comprising:
   an evaluation unit that is connected downstream of the measurement signal operation devices and that is configured to analyze the auxiliary signals, wherein the evaluation unit comprises at least one or more of a comparator and a window discriminator and is configured to analyze one or more of the first measurement values and the at least one second measurement value.

23. An AC plasma power supply device comprising a generator that supplies power to a plasma load, to which the output power generated is supplied and from which reflected power is directed back to the plasma power supply device at least in the event of mismatching, the plasma power supply device comprising:
   a measurement signal processing apparatus for processing at least two measurement signals from the AC plasma power supply device, the measurement signal processing apparatus comprising a measurement signal operation device associated with each measurement signal and configured to generate an auxiliary signal having a constant AC amplitude; and
   at least two measurement locations between the generator and the plasma load that enable detection of the measurement signals at the respective measurement locations.

24. The plasma power supply device of claim 23, further comprising a transfer device configured to transfer blanking pulses for the pulsed generator to the measurement signal processing apparatus.

25. The plasma power supply device of claim 23, wherein the at least two measurement locations are local to each other but have different circumstances.

26. A method for processing at least two measurement signals from an AC plasma power supply, the method comprising:
   detecting the at least two measurement signals along a power supply line between a generator of the AC plasma power supply and a plasma load that is connected to the AC plasma power supply;
   generating an auxiliary signal having a constant AC amplitude from each of the measurement signals by amplifying the at least two measurement signals using an amplification feedback control loop.

27. The method of claim 26, further comprising generating first measurement values that represent the amplitudes of respective measurement signals when the measurement signals are processed to form the auxiliary signals.

28. The method of claim 27, wherein the first measurement values are generated from amplification factors that are applied to the respective measurement signals with an amplifier.

29. The method of claim 26, further comprising:
converting the measurement signals into intermediate frequency signals by heterodyning with a constant heterodyne frequency the measurement signals, wherein the heterodyne frequency is substantially identical for all the measurement signals, and
processing the intermediate frequency signals with the amplification feedback control loop to form the auxiliary signals.

30. The method of claim 26, further comprising:
evaluating the auxiliary signals by passing each auxiliary signal through a one-bit converter, and establishing a zero crossing of each auxiliary signal with a zero crossing detector, and
generating at least one second measurement value from one or more of the evaluation result including the established zero crossings and the first measurement values.

31. The method of claim 30, wherein at least one second measurement value includes the phase shift ($\phi$) between two auxiliary signals, and the phase shift is generated by calculating a time difference ($\Delta t$) between zero crossing of the auxiliary signals.

32. The method of claim 26, further comprising determining a phase shift between the at least two measurement signals by determining a time difference between zero crossings of the auxiliary signals.

* * * * *